(12) United States Patent
Schafer et al.

(10) Patent No.: US 10,660,225 B2
(45) Date of Patent: May 19, 2020

(54) MAGNETIC LATCH FOR A DISPLAY MODULE

(71) Applicant: Daktronics, Inc., Brookings, SD (US)

(72) Inventors: Gregory Schafer, Brookings, SD (US); Ryan Hemiller, Brookings, SD (US)

(73) Assignee: Daktronics, Inc., Brookings, SC (US)

( * ) Notice: Subject to any disclaimer, the term of this patent is extended or adjusted under 35 U.S.C. 154(b) by 0 days.

(21) Appl. No.: 16/151,892

(22) Filed: Oct. 4, 2018

(65) Prior Publication Data
US 2019/0208655 A1    Jul. 4, 2019

Related U.S. Application Data

(60) Provisional application No. 62/613,298, filed on Jan. 3, 2018.

(51) Int. Cl.
| H05K 7/02 | (2006.01) |
| H05K 7/04 | (2006.01) |
| H05K 5/02 | (2006.01) |
| G09F 9/33 | (2006.01) |
| G09F 9/302 | (2006.01) |
| H05K 5/00 | (2006.01) |

(52) U.S. Cl.
CPC ......... *H05K 5/0221* (2013.01); *G09F 9/3026* (2013.01); *G09F 9/33* (2013.01); *H05K 5/0017* (2013.01)

(58) Field of Classification Search
USPC ........................................................ 361/807
See application file for complete search history.

(56) References Cited

U.S. PATENT DOCUMENTS 9,845,816 B2 * 12/2017 Brashnyk .............. G09F 9/3026
2017/0006727 A1 * 1/2017 Ryu ..................... H01L 25/0753

FOREIGN PATENT DOCUMENTS

| WO | WO-2016109439 A1 | 7/2016 |
| WO | WO-2019135811 A1 | 7/2019 |

OTHER PUBLICATIONS

"International Application Serial No. PCT/US2018/054358, International Search Report dated Jan. 25, 2019", 3 pgs.
"International Application Serial No. PCT/US2018/054358, Written Opinion dated Jan. 25, 2019", 7 pgs.

* cited by examiner

*Primary Examiner* — Hung S. Bui
(74) *Attorney, Agent, or Firm* — Schwegman Lundberg & Woessner, P.A.

(57) ABSTRACT

A display module comprises a support structure, a plurality of light-emitting elements mounted to the support structure, and a latch assembly that includes a latch plate comprising a magnetically-engageable material, wherein the latch plate is moveable relative to the module support structure within a range of motion between a first position and a second position. The magnetically-engageable material of the latch plate forms a first magnetic attraction force between the latch plate and a support chassis mating structure when the latch plate is in the first position to at least partially secure the display module to the support chassis. A corresponding magnetic device can generate a second magnetic attraction force between the corresponding magnetic device and the latch plate that overcomes the first magnetic attraction force and moves the latch plate from the first position to the second position.

19 Claims, 9 Drawing Sheets

MAGNETIC LATCH FOR A DISPLAY MODULE

CLAIM OF PRIORITY

This patent application claims the benefit of priority to U.S. Provisional Application Ser. No. 62/613,298, titled "MAGNETIC LATCH AND TOOL FOR REMOVABLY COUPLING A DISPLAY MODULE TO A CABINET," filed Jan. 3, 2018, which is incorporated by reference herein in its entirety.

BACKGROUND

Displays comprising a plurality of light-emitting elements are used to display one or more of textual, graphical, or video information. In some applications, such as digital billboards or scoreboards, individual display modules are connected to one or more support structures and operated collectively to form a larger display.

SUMMARY

The present disclosure describes a system for selectively and removable coupling display modules to a support chassis. In particular, the present disclosure describes a mounting apparatus that can relatively easily and relatively rapidly disengaged so that a particular display module can be decoupled and separated from the support chassis when desired, but that will otherwise provide for secure coupling between the display module and the support chassis. The mounting apparatus includes a latching mechanism (also referred to simply as a "latch") with a movable latch plate that magnetically engages with a mating structure in or on the support chassis to secure a rear face of the display module to the support chassis. The movable latch plate can also be magnetically engaged by a magnetic device that is positioned on a front face of the display module to disengage the latch plate from its magnetic engagement with the chassis mating structure, allowing the display module to be separated and removed from the support chassis.

This summary is intended to provide an overview of subject matter of the present disclosure. It is not intended to provide an exclusive or exhaustive explanation of the invention. The detailed description is included to provide further information about the present disclosure.

BRIEF DESCRIPTION OF THE FIGURES

The drawings illustrate generally, by way of example, but not by way of limitation, various embodiments discussed in the present document.

DETAILED DESCRIPTION

Figure 1:
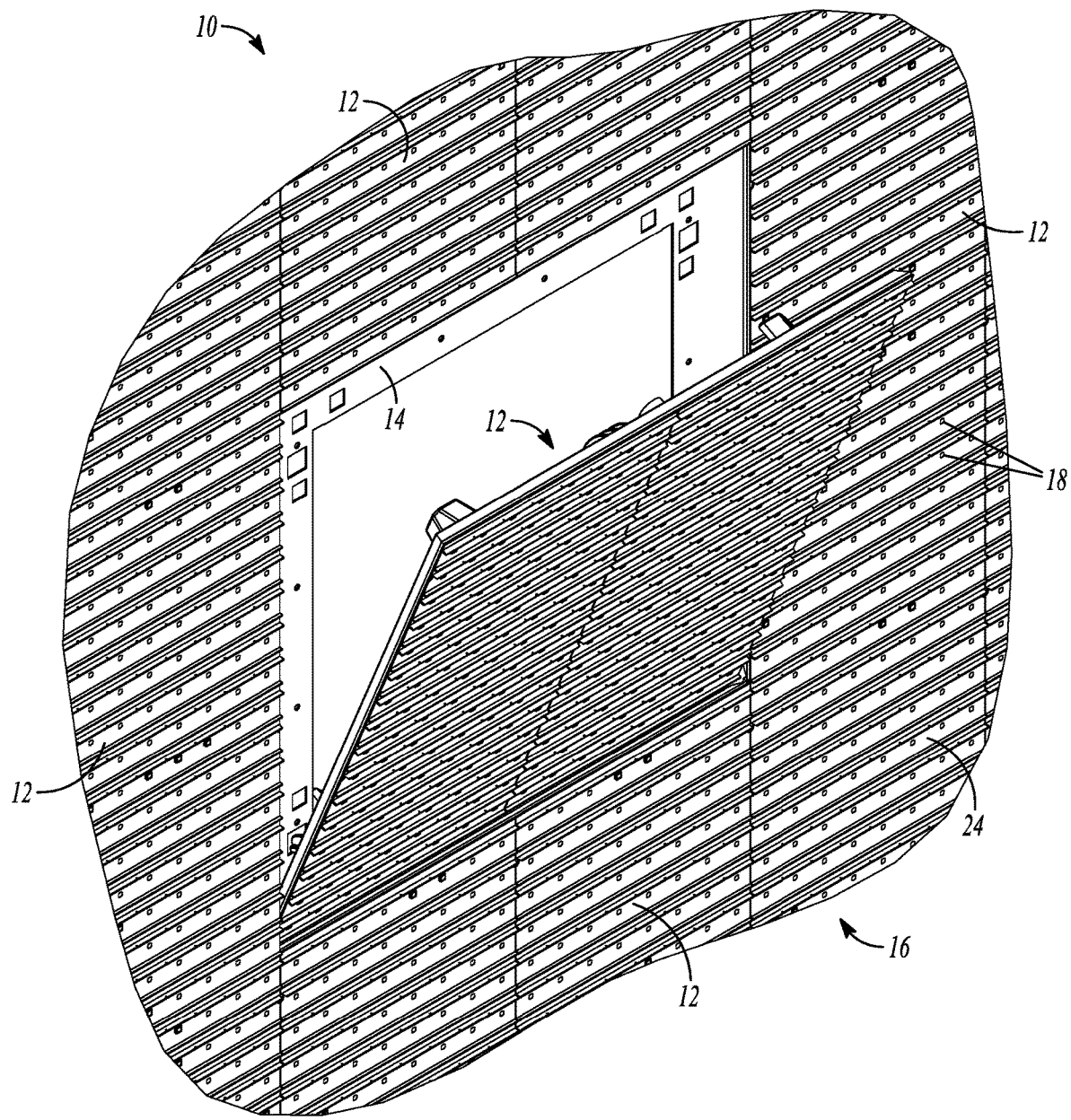
FIG. 1 is a partial perspective view of an example display comprising a plurality of individual display modules that are operated in a cooperative manner to display information on the light-emitting display.

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The example embodiments may be combined, other embodiments may be utilized, or structural, and logical changes may be made without departing from the scope of the present invention. While the disclosed subject matter will be described in conjunction with the enumerated claims, it will be understood that the exemplified subject matter is not intended to limit the claims to the disclosed subject matter. The following detailed description is, therefore, not to be taken in a limiting sense, and the scope of the present invention is defined by the appended claims and their equivalents.

References in the specification to "one embodiment", "an embodiment," "an example embodiment," etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a concentration range of "about 0.1% to about 5%" should be interpreted to include not only the explicitly recited concentration of about 0.1 wt. % to about 5 wt. %, but also the individual concentrations (e.g., 1%, 2%, 3%, and 4%) and the sub-ranges (e.g., 0.1% to 0.5%, 1.1% to 2.2%, and 3.3% to 4.4%) within the indicated range.

In this document, the terms "a," "an," or "the" are used to include one or more than one unless the context clearly dictates otherwise. The term "or" is used to refer to a nonexclusive "or" unless otherwise indicated. Unless indicated otherwise, the statement "at least one of" when referring to a listed group is used to mean one or any combination of two or more of the members of the group. For example, the statement "at least one of A, B, and C" can have the same meaning as "A; B; C; A and B; A and C; B and C; or A, B, and C," or the statement "at least one of D, E, F, and G" can have the same meaning as "D; E; F; G; D and E; D and F; D and G; E and F; E and G: F and G; D, E, and F; D, E, and G; D, F, and G; E, F, and G; or D, E, F, and G." A comma can be used as a delimiter or digit group separator to the left or right of a decimal mark; for example, "0.000,1"" is equivalent to "0.0001."

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

The term "about" as used herein can allow for a degree of variability in a value or range, for example, within 10%, within 5%, within 1%, within 0.5%, within 0.1%, within 0.05%, within 0.01%, within 0.005%, or within 0.001% of a stated value or of a stated limit of a range, and includes the exact stated value or range.

The term "direction" used herein can refer to, unless otherwise specified, to a linear direction for the purposes of describing or characterizing a physical location of a particular structure, for example to describe the physical location of one structure relative to another structure. In some specific examples, the term "direction" is used to refer to one or more reference directions for the purposes of describing or characterizing relative positioning of one structure relative to another. For example, a common set of reference directions that are well known to those of skill in the art are the directions used to describe three-dimensional Euclidean space, and in particular the directions associated with each axis of a three-dimensional Cartesian coordinate system. As will be appreciated by those having skill in the art, Cartesian coordinates are often used to define positions within a three-dimensional space by defining three imaginary reference axes, typically named the "x-axis," the "y-axis," and the "z-axis," which are pairwise perpendicular. These axes can also be used to define a "direction" associated with each axis, referred to herein as an "x-direction" defined as a linear direction that is parallel to the x-axis (but not necessarily coincident with the x-axis), a "y-direction" defined as a linear direction that is parallel to the y-axis (but not necessarily coincident with the y-axis), and a "z-direction" defined as a linear direction that is parallel to the z-axis (but not necessarily coincident with the z-axis).

The term "substantially" as used herein refers to a majority of, or mostly, such as at least about 50%, 60%, 70%, 80%, 90%, 95%, 96%, 97%, 98%, 99%, 99.5%, 99.9%, 99.99%, or at least about 99.999% or more, or 100%.

In addition, it is to be understood that the phraseology or terminology employed herein, and not otherwise defined, is for the purpose of description only and not of limitation. Any use of section headings is intended to aid reading of the document and is not to be interpreted as limiting, and information that is relevant to a section heading may occur within or outside of that particular section. All publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods described herein, the acts can be carried out in any order without departing from the principles of the disclosed method, except when a temporal or operational sequence is explicitly recited. Furthermore, specified acts can be carried out concurrently unless explicit language recites that they be carried out separately. For example, a recited act of doing X and a recited act of doing Y can be conducted simultaneously within a single operation, and the resulting process will fall within the literal scope of the process. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first and steps B, C, D, and E can be carried out in any sequence between steps A and E, and that the sequence still falls within the literal scope of the claimed process. A given step or sub-set of steps may also be repeated.

Electronic Display

FIG. 1 shows an example of an information display 10 (also referred to simply as "display 10") that is configured to display one or more of video, graphical, or textual information. The display 10 includes one or more individual display modules 12 mounted to one or more supports, such as a support chassis 14 (also referred to as a frame 14). In an example, one or both of each display module 12 or the support chassis 14 includes a mounting structure or apparatus at one or more locations relative each display module 12, such as one or more latches (described in more detail below). In examples wherein the display 10 is formed from a plurality of the display modules 12, the plurality of display modules 12 operate together so that the overall display 10 appears as a single, larger display. FIG. 1 shows one of the display modules 12 being in a pivoted or tilted position relative to the support chassis 14, which can occur when that display module 12 is in the process of being mounted to, or dismounted from, the support chassis 14. The display 10 of the present disclosure is not limited to a setup where the display modules 12 are pivoted or tilted during installation onto or removal from the support chassis 14. In some examples, each display module 12 can be placed onto the support chassis 14 (during installation) or pulled off of the support chassis 14 (during removal) in a "straight on"

orientation, e.g., with the plane of the support chassis 12 being parallel or substantially parallel with the plane of the support chassis 14 during at least the last portion of display module position during installation and during at least the first portion of display module removal during uninstallation. The other display modules 12 in the display 10 have already been mounted to the support chassis 14, such as with one or more latches or other mounting hardware (an example of which being described below).

The display 10 can include a display surface 16 configured to display the video, graphical, or textual information from the display 10. A plurality of light-emitting elements 18 is mounted to the display surface 16. For example, light-emitting elements can be mounted to one or more module support structures on each of the display module 12, such as one or more of a circuit board, potting, or a module frame of a corresponding display module 12. The light-emitting elements 18 are operated together to display the video, graphical, or textual information on the display 10.

The light-emitting elements 18 can be any type of light-emitting technology known or yet to be discovered for the emission of light from a small area (e.g., from a pixel area), particularly for light-emitting technology that is or can be used display of visual information, such as video, graphical, or textual information. At the time of filing of the present application, light-emitting diodes (LEDs) are one of the most common light-emitting technologies in use for video or graphical displays of the type described herein. As such, for the sake of brevity, the remainder of the present disclosure will refer to light-emitting elements that can be used in a display (including the light-emitting elements 18 shown in FIGS. 1 and 2) will be referred to as LEDs 18. Those of skill in the art will appreciate, however, that any time the present disclosure uses the term "light-emitting diode" or "LED," that light-emitting devices other than LEDs can be used, including, but not limited to, liquid crystal display devices (LCDs), organic light-emitting diodes (OLEDs), organic light-emitting transistors (OLETs), surface-conduction electron-emitter display devices (SEDs), field-emission display devices (FEDs), laser TV quantum dot liquid crystal display devices (QD-LCDs), quantum dot light-emitting diode display devices (QD-LEDs), ferro-liquid display devices (FLDs), and thick-film dielectric electroluminescent devices (TDELs).

Figure 2:
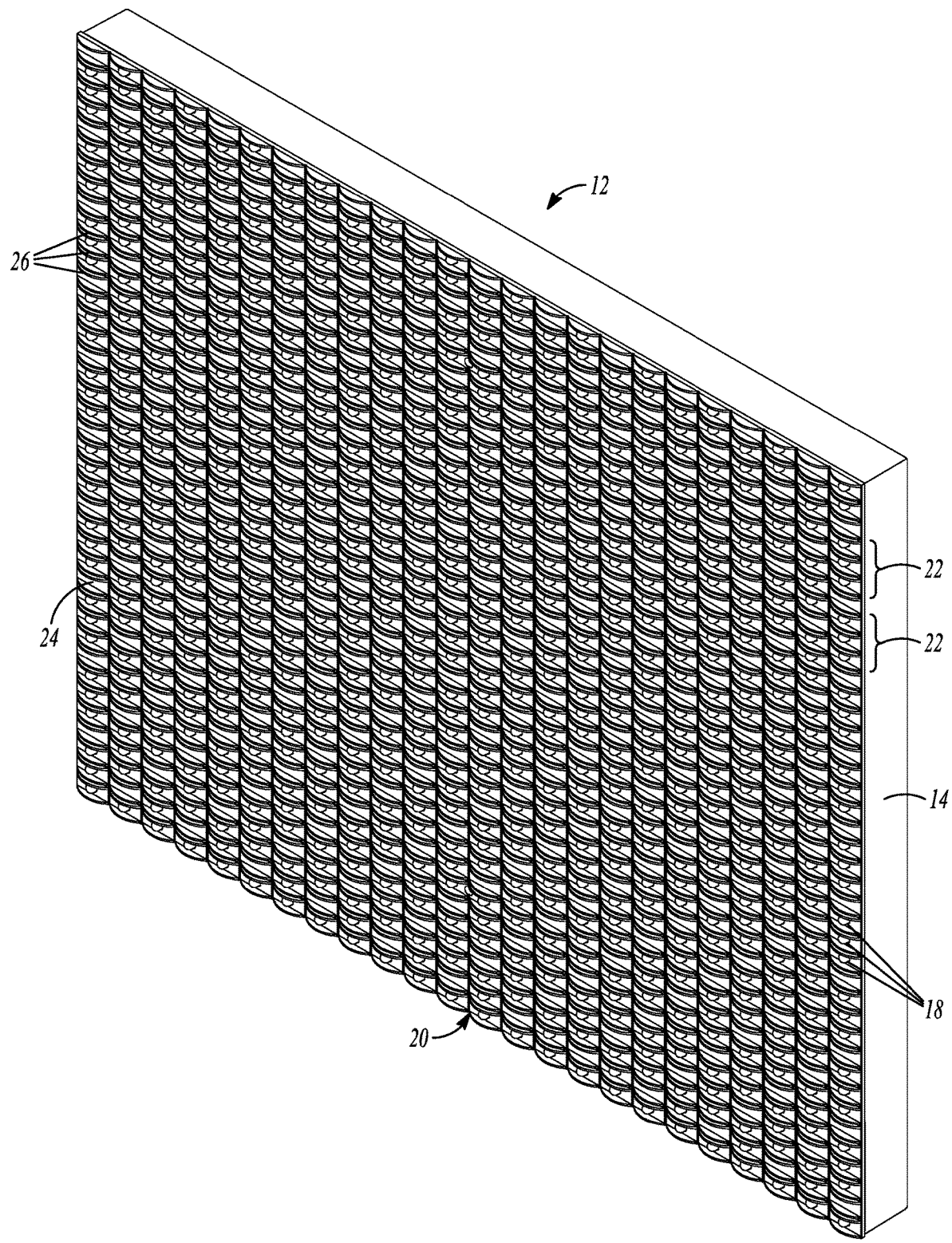
FIG. 2 is a perspective view of an example display module, which can be used as one of the individual display modules in the example display of FIG. 1.

FIG. 2 is a perspective view of an example display module 12 that can be used in the display 10 of FIG. 1. The display module 12 includes a front face 20 configured to provide for a display of graphics or video content. A plurality of the LEDs 18 are mounted to the front face 20 by being mounted onto a module support structure, such as an electronics circuit board or a module frame. The LEDs 18 can be operated in such a way that the display module 12 will display a portion of the video, graphical, or textual information to be shown on the display 10. The front face 20 of the display module 12 is aligned and oriented relative to front faces 20 of one or more adjacently-positioned display modules 12 so that the front faces 20 combine and cooperatively form the overall display surface 16 of the full display 10 (shown in FIG. 1). The plurality of display modules 12 are operated together in such a way as to display the video, graphical, or textual information in a cohesive manner so that the entire display 10 appears to a viewer as a single display that is larger than the individual display modules 12.

In an example, the LEDs 18 are arranged into an array of pixels 22 (best seen in FIG. 2). Each pixel 22 includes one or more LEDs 18 grouped together in close proximity. The proximity of the pixels 22 allows the display 10 to be operated in such a way that they will appear to a viewer of the display 10 to form recognizable shapes, such as letters or numbers to display textual information or recognizable shapes to display graphical or video information. In some examples, the plurality of LEDs 18 include a plurality of different-colored LEDs 18 such that different-colored LEDs 18 of each pixel 22 can be cooperatively operated to display what appears to be a spectrum of different colors for the viewer of the display 10. In an example, each pixel 22 includes a red LED 18, a green LED 18, and a blue LED 18, wherein the red, green, and blue LEDs of each pixel 22 cooperate to provide essentially the entire color spectrum that is visible to humans based on whether one, two, or all three of the LEDs 18 in a pixel 22 are lit, and at what intensities. The display 10 can also provide a black or empty looking surface over a portion of the display, when desired, by deactivating or turning off the LEDs in a designated area of pixels 22.

In the example shown in FIG. 2, each pixel 22 includes a plurality of LEDs 18 arranged in a specified pixel shape. The example of FIG. 2 shows a linear or substantially linear pixel shape comprising three LEDs 18 (e.g., corresponding to the red LED 18, green LED 18, and blue LED 18 discussed above) that are aligned or substantially aligned in a common direction, such as in the vertically aligned pixel shape of the pixels 22 shown in FIG. 2. Those of skill in the art will appreciate that pixel shapes other than a vertical or substantially vertical pixel 22 can be used, including, but not limited to: a linear or substantially linear pixel oriented in a direction other than vertical (e.g., a horizontal or substantially horizontal pixel shape or a diagonal linear pixel shape), or geometrical pixel shapes with one or more LEDs at each vertex of a specified geometrical shape (such as a triangular pixel formed from three LEDs, a quadrilateral pixel formed from four LEDs, and so on).

In an example, the pixels 22 are arranged in a grid-like array, such as a grid including a specified number of rows and a specified number of columns of the pixels 22. The display 10 can be controlled, for example with control software and/or one or more hardware controllers, so that visual information, e.g., video, graphical, or textual information, is broken down into coordinates. Each coordinate can correspond to a specific pixel location within the overall display 10, and the control software and/or the one or more hardware controllers can operate each pixel according to a program that specifies a condition for each coordinate within the display 10 and controls each of the pixels 22 so that it will appear to emit light that meets the condition specified. For example, if the display 10 is displaying a series of textual messages, the control software and/or the one or more hardware controllers can be fed the data corresponding to the series of textual messages, and the control software and/or the one or more hardware controllers can break the text of the messages down into conditions for each pixel 22, such as the time within the series of messages, the color that a pixel 22 is to display at that time (if the display 10 is a multi-colored display) and the intensity of the pixel 22 at that time. The control software and/or the one or more hardware controllers can also convert the information regarding color and intensity into specific operating parameters for each LED 18 in a particular pixel 22, such as the power that will be supplied to the red LED 18, the blue LED 18, and the green LED 18 in that pixel 22 and for how long in order to achieve the specified color and intensity at the specified time. The control software and/or the one or more hardware controllers can then send control signals to the pixels 22 or to individual LEDs 18 that can operate the pixels 22 according to the specified series of textual messages. Although a grid or grid-like array of LED pixels, as summarized above, is common, the display 10 described herein can use other arrangements of the LEDs 18 or other systems for addressing the LEDs 18 can be used without varying from the scope of the present invention.

The display 10 can include a face cover 24 that is placed over a front face of the display 10. The face cover 24 can provide protection for one or more of the LEDs 18, the display surface 16, and the electrical components of the display modules 12 that provide for the operation of the LEDs 12. The face cover 24 can also include structures that can shade one or more corresponding LEDs 18 from direct sunlight or other bright lighting in order to improve one or more of visibility, readability, or overall appearance of the video, graphical, or textual information being displayed by the LEDs 18 of the display 10 (e.g., by preventing or reducing glare off of the LEDs 18, which is known to interfere with projection of a true color from the LEDs 18), such as the louvers 26 shown in FIG. 2.

Display Module Installation and Removal

As described above, a display can be formed from a plurality of display modules coupled to one or more support structures in close proximity in order to form a larger overall display surface, such as the plurality of display modules 12 coupled to the support chassis 14 in order to form the overall display surface 16 of the display 10 in FIG. 1. As is also described above, the display modules and/or the support chassis can include one or more mounting structures or apparatuses configured to couple the one or more display modules to the support chassis. In some examples, the one or more mounting structures or apparatuses can provide for selective and removable coupling of each display module to and from the support chassis. As used herein, the terms "selective removable coupling" or "selectively removably couple," and the like, refer the one or more mounting structures or apparatuses being able to be relatively easily and relatively rapidly disengaged so that a particular display module can be decoupled and separated from the support chassis when desired, but that will otherwise provide for secure coupling between the display module and the support chassis (i.e., so that the display module will remain coupled when it is desired for the display module to be coupled, but that can be removed relatively easily).

Magnetic Installation/Removal Tool and Latch

In the examples described in more detail below, the mounting hardware or mounting apparatuses that provide for the selective removable coupling of the display modules include one or more magnetic latching structures (also referred to simply as "magnetic latches") that provide for magnetic engagement between each display module and the support chassis at one or more points along a rear face of the display module. As used herein, the term "magnetic engagement" (and similar terms such as "magnetically engage") refers to a magnetic attraction force being formed between one or more structures on the display module and one or more structures on the support chassis with sufficient magnitude that collectively the magnetic latches will hold the display module in place relative to the support chassis 14. In some examples, magnetic engagement between the one or more structures of the display module and the one or more structures of the support chassis so that collectively the one or more magnetic latches can support the weight of the display module without the use of any additional fastening or coupling structures other than the magnetic engagement between the display module and the support chassis formed at the magnetic latches.

Figure 3:
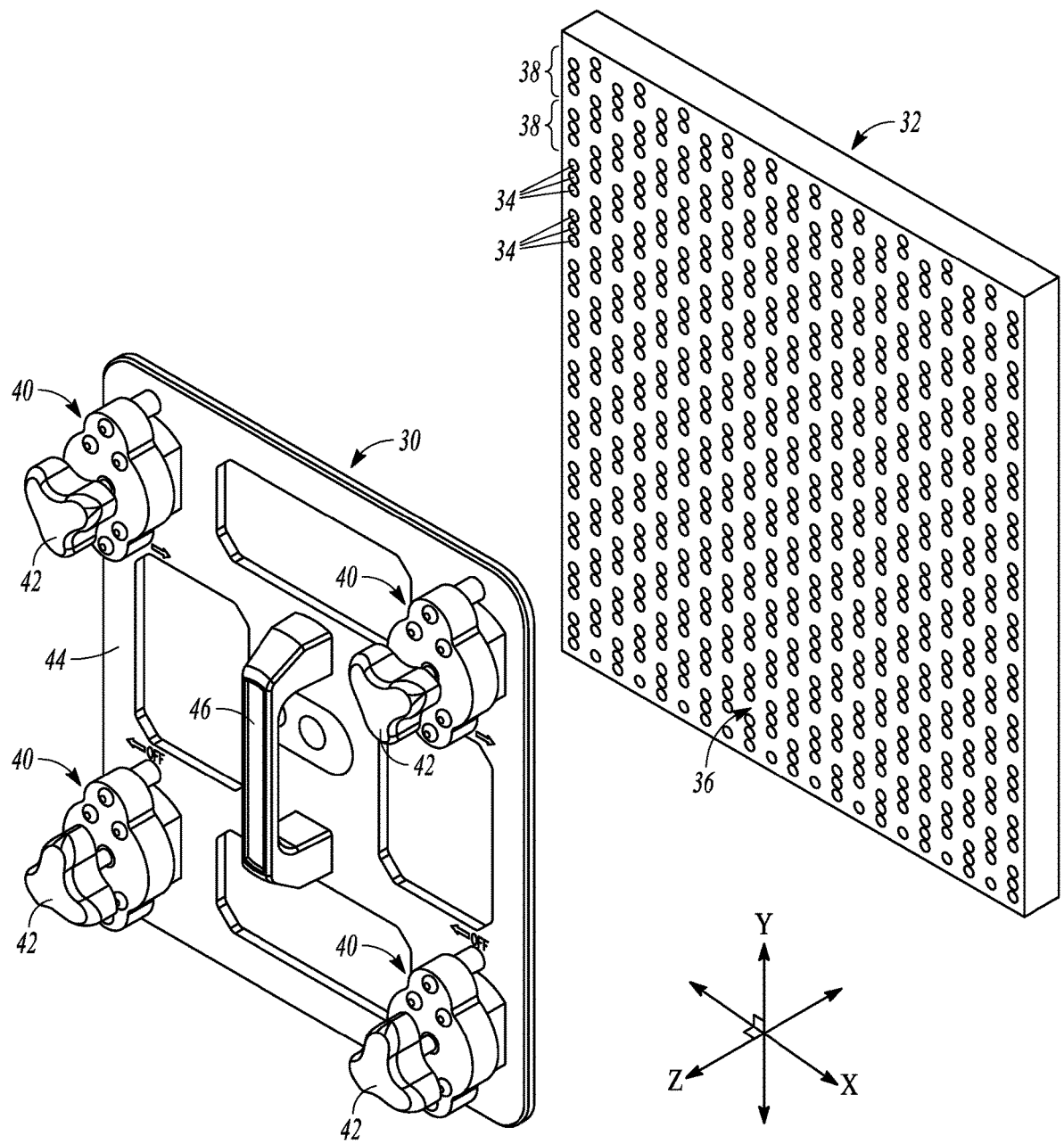
FIG. 3 is a perspective view of an example display module installation and removal tool and an example display module that can be installed onto a support chassis with the installation and removal tool.
Figure 4:
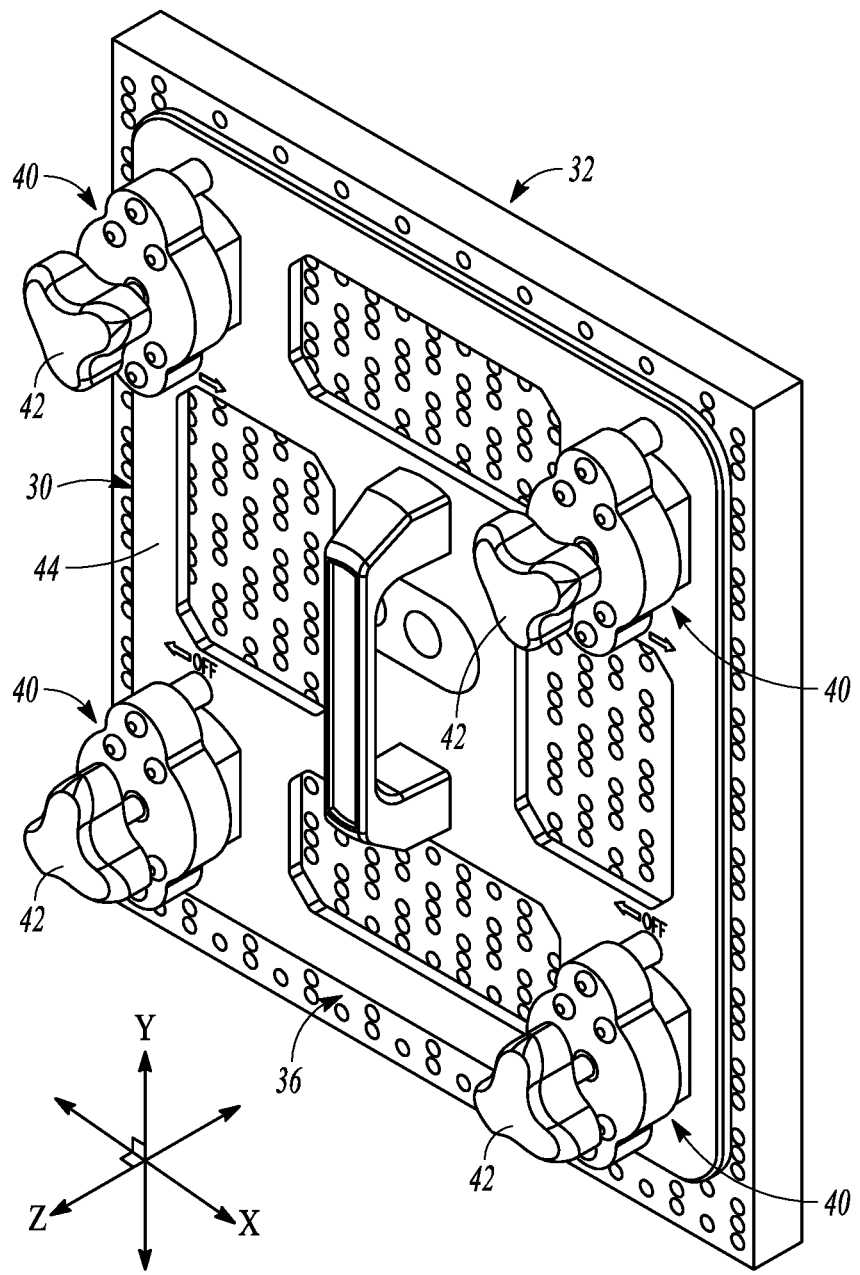
FIG. 4 is a perspective view of the example installation and removal tool of FIG. 3 placed against a front face of the display module, which can allow one or more magnetic devices of the installation and removal tool to engage one or more corresponding magnetic latches on the display module to magnetically secure the display module to the installation and removal tool.
Figure 5:
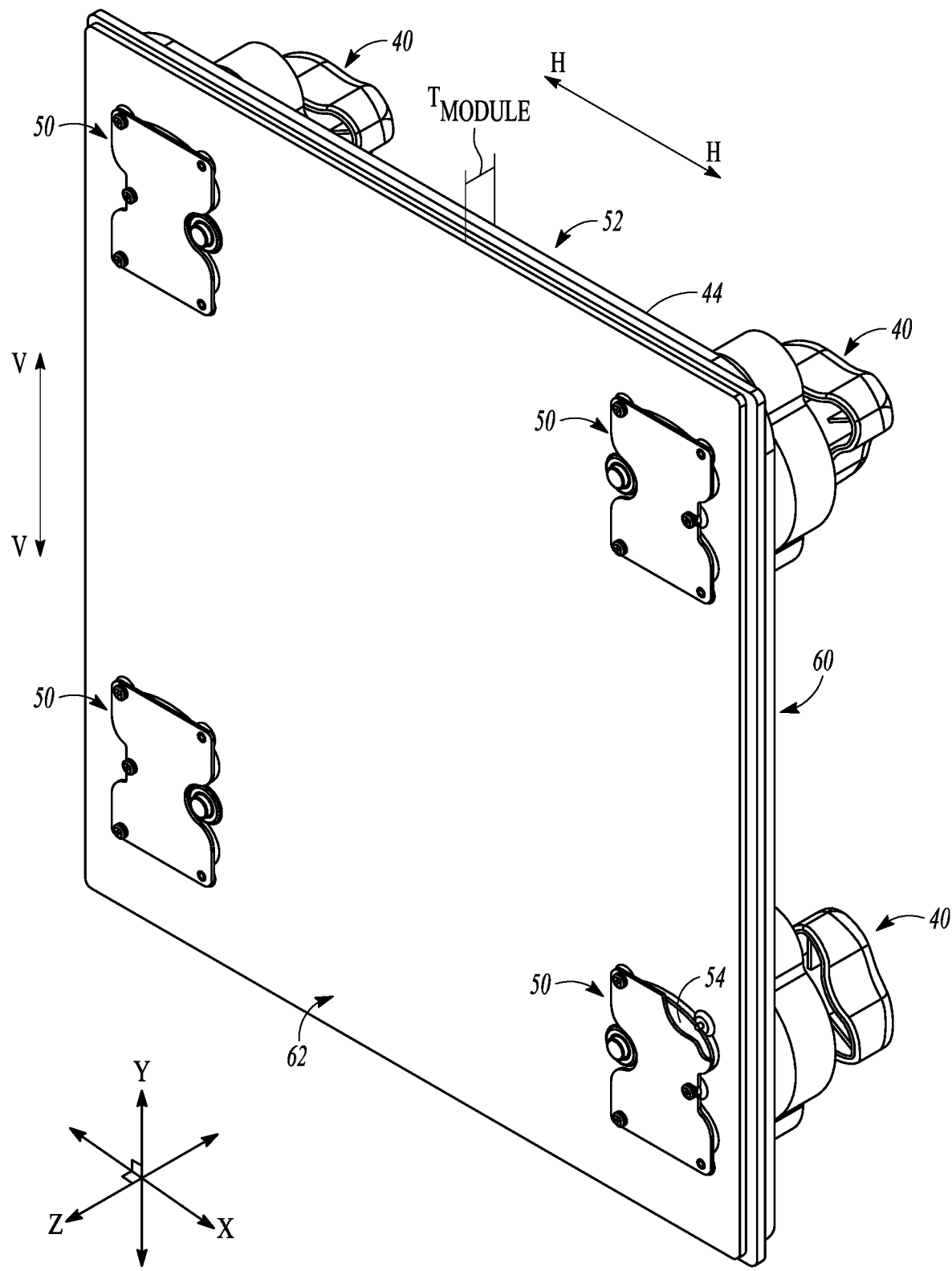
FIG. 5 is a perspective view and a rear face of an example display module comprising a plurality of floating-plate magnetic latches, with an example installation and removal tool positioned against the front face of the display module to magnetically engaged with floating latch plates of the magnetic latches.

In some examples, one or more installation or removal tools can be provided to assist in positioning a display module relative to the support chassis. FIGS. 3 and 4 show an example of an installation and removal tool 30 (referred to simply as "installation tool 30" for brevity) that can be used to hold and position an example display module 32 during installation and coupling of the display module 32 to a support chassis (not shown in FIGS. 3 and 4, but which could be similar to the support chassis 14 shown in FIG. 1). The display module 32 is shown relatively generically in FIGS. 3 and 4, however, those of ordinary skill in the art will appreciate that the display module 32 can be substantially similar or identical to the example display module 12 with respect to the technical features described above. For example, the display module 32 shown in FIGS. 3 and 4 includes a plurality of light-emitting elements 34 (which, as described above, can be light-emitting diodes (LEDs) or any other type of light-emitting device, but which will be referred to hereinafter as LEDs 34 for brevity) mounted to a front face 36 of the display module 32. The LEDs 34 can be arranged in groupings that can correspond to individual pixels 38 (e.g., to display one or more of video, graphical, or textual information). In the example shown in FIGS. 3 and 4, the LEDs 34 are arranged in generally linear pixels 38, such as the generally vertical pixels 38 shown in FIGS. 3 and 4.

In the example shown in FIGS. 3 and 4, the installation tool 30 includes one or more magnetic devices 40, such as the four magnetic devices 40 shown in FIGS. 3 and 4. As described in more detail below, in an example, the installation tool 30 includes one magnetic device 40 for each of the one or more magnetic latch structures (described in more detail below, and referred to hereinafter as "magnetic latches" for brevity). In such an example, each magnetic device 40 acts to move at least one structure within its corresponding magnetic latch between a first position and a second position. When the one or more magnetic latches are in the unsecured position, the display module 32 can be pulled away from the support chassis. When the one or more magnetic latches are in the secured position, the magnetic latch acts to hold the display module 32 in a desired position relative to the support chassis, i.e., to hold the display module 32 in a desired position within a larger display surface formed by a plurality of display modules (all or some of which may also be secured to the support chassis with the same or similar magnetic latches).

Each magnetic device 40 includes one or more structures, devices, or mechanisms that can controllably generate a magnetic attraction force between the magnetic device 40 and one or more mating magnetic or magnetizable structures of the magnetic latch (referred to hereinafter as "mating structure" for brevity) corresponding to that magnetic device 40. This magnetic attraction force moves the one or more mating structures of the corresponding magnetic latch between a non-latching position corresponding to the unsecured position of the overall magnetic latch and a latching position corresponding to the secured position of the overall magnetic latch. In one example, described in more detail below, the magnetic device 40 includes a physical magnet (not shown in FIGS. 3 and 4) that can be moved between a first position relative to the corresponding mating structure where the magnetic attraction force is generated and a second position relative to the corresponding mating structure where the magnetic attraction force is not generated. In an example, movement between the first and second positions of the physical magnet includes rotating the physical magnet relative to the mating structure of the corresponding magnetic latch. In another example, the magnetic device 40 comprises an electromagnetic mechanism that can generate an electromagnetic attraction force that attracts the corresponding mating structure when activated and can reduce or cease the electromagnetic attraction force when deactivated. As will be appreciated by those of skill in the art, each magnetic device 40 is not limited to these specific examples of magnetic device, or to any other particular magnetic device. Rather, those of skill in the art will be able to conceive of or obtain other configurations of magnetic device that can be used to generate or cease the magnetic attraction force between the magnetic device 40 and the corresponding magnetic latch.

In an example, when the magnetic device 40 is in a first magnetic state (also referred to as the "attracting state"), a magnetic attraction force is generated between the magnetic device 40 and the mating structure of the magnetic latch with sufficient magnitude to hold the mating structure of the magnetic latch away from a position where it can engage the support chassis (e.g., so that the mating magnetic structure cannot magnetically engage the support chassis to hold the display module 32 in place). When the magnetic device 40 is changed to a second magnetic state (also referred to as the "non-attracting state"), the magnetic attraction force between the magnetic device 40 and the mating structure ceases or is reduced in magnitude such that the magnetic device 40 can no longer hold the mating structure away from the support chassis, at which point a mounting magnetic attraction force between the mating structure and one or more structures on the support chassis causes takes over, wherein the mounting attraction force is sufficiently strong so that collectively all of the magnetic latches can hold the display module 32 in position relative to the support chassis.

Each magnetic device 40 can include one or more controls, such as the control knob 42 shown in the example of FIGS. 3 and 4, that can change the magnetic device 40 from an attracting state where the magnetic attraction force is generated between the magnetic device 40 and the corresponding mating structure (e.g., by moving a physical magnet into a first position or by activating an electromagnetic mechanism) and a non-attracting state where the magnetic attraction force is not generated or where the magnetic attraction force is reduced such that the mating structure is not attracted to the magnetic device 40 (e.g., by moving the physical magnet into the second position or by deactivating the electromagnetic mechanism).

In the example shown in FIGS. 3 and 4, the installation tool 30 includes a tool body 44 onto which a plurality of the magnetic devices 40 are mounted at specified locations relative to one another. The tool body 44 ensures that the magnetic devices 40 will be positioned in a specified arrangement when the installation tool 30 is placed against the display module 32, i.e., so that all of the magnetic devices 40 will be properly positioned with respect to its corresponding magnetic latch. The installation tool 30 can also include a handle 46 that an installer or maintenance person can use to hold and manipulate the installation tool 30 during installation or removal of the display module 32 using the installation tool 30.

Floating Plate Magnetic Latch

FIGS. 5-9 show several views of an example magnetic latching structure 50 (also referred to as a "magnetic latch 50," for brevity) that is incorporated into or on a display module 52 (which can be similar or identical to the display module 12 shown in FIGS. 1 and 2 or the display module 52 shown in FIGS. 3 and 4). As described above, a corresponding magnetic device of the installation tool 30 is configured to controllably generate a magnetic attraction force between the magnetic device 40 and a corresponding mating structure in the magnetic latch 50, which in turn moves the mating structure between a non-latching position and a latching position. In the example shown in FIGS. 5-9, the mating structure of the magnetic latch 50 comprises a latch plate 54 that moves between a latching position and a non-latching position. As described above, when the latch plate 54 is in the latching position, the latch plate 54 magnetically engages with a structure on or in a support chassis 56 to which the display module 52 is to be mounted (shown in FIGS. 8 and 9) to secure the display module 52 to the support chassis 56. When the latch plate 54 is in the non-latching position, the latch plate 54 is magnetically engaged by the magnetic device 40 or magnetically engages the magnetic device 40, or both, so that the display module 52 can be held by the installation tool 30 for positioning the display module 52 onto the support chassis 56 during installation or for separating the display module 52 from the support chassis 56 during uninstallation.

The latch plate 54 can include one or more structures made from a magnetically-engageable material so that the magnetic attraction force can be generated between the latch plate 54 and the magnetic device 40 of the installation tool 30. As used herein, the term "magnetically-engageable material," when referring to the latch plate 54, the mating structure of the support chassis 56, or the magnetic device 40, refers to a material that can form a magnetic attraction force with one of the other structures described herein (e.g., for the latch plate 54, a magnetic engagement with the magnetic device 40). The magnetically-engageable material of the latch plate 54 can also form a magnetic attraction force between the latch plate 54 and a mating structure that is in or on the support chassis 56. In order to clarify which magnetic attraction force is being referred to, hereinafter the magnetic attraction force between the magnetic device 40 and the latch plate 54 will be referred to as the "tool magnetic force $F_{Tool}$" while the magnetic attraction force between the latch plate 54 and the mating structure of the support chassis 56 will be referred to as the "mounting magnetic force $F_{Mount}$." In some examples, such as the example shown in FIGS. 8 and 9, the mating structure that is in or on the support chassis 56 comprises one or more magnets 58 mounted onto or into the support chassis 56 (referred to hereinafter the "chassis magnet 58" or "chassis magnets 58") that generates a magnetic field to at least partially form the mounting magnetic force $F_{Mount}$. In other examples, the latch plate 54 itself might be sufficiently magnetic to generate all or a substantial portion of the mounting magnetic force $F_{Mount}$ such that the mating structure of the support chassis 56 may not need to be a magnet itself.

In some examples, the magnetically-engageable material of the latch plate 54 comprises a material that is itself a magnetic material, such that the latch plate 54 itself can at least partially form the tool magnetic force $F_{Tool}$ or the mounting magnetic force $F_{Mount}$, or both. As used herein, the term "magnetic material," such as is used with respect to the latch plate 54 or the mating structure of the support chassis 56, refers to a material that can form its own magnetic field without any other material or device activating or otherwise enabling the magnetic field. In other examples, the magnetically-engageable material of the latch plate 54 comprises a magnetizable material. As used herein the term "magnetizable material," such as is used with respect to the latch plate 54 or the mating structure of the support chassis 56, refers to a material that can be magnetically attracted to a separate magnetic structure when positioned within the magnetic field of the separate magnetic structure. In some examples, the magnetically-engageable material of the latch plate 54 can be both magnetic itself (e.g., generates at least a small magnetic field) and magnetizable by a more powerful magnetic structure or device.

Specific examples of magnetically-engageable materials that can be used to form at least part of the latch plate 54 include, but are not limited to: magnetizable metals (such as a ferromagnetic metal, including magnetizable steel such as magnetizable stainless steel, magnetizable iron, or a magnetizable ferromagnetic alloy); magnetizable or magnetic polymers (such as magnetizable polyaniline or tetracyanoquinodimethane); or a composite materials that include at least one magnetic or magnetizable material (including a solid-solid composite material, such as a composite with magnetizable fibers, particles, or other structures embedded in polymer matrix, or a solid-liquid composite material, such as a liquid or semi-liquid base material with particles of a magnetizable metal or other magnetizable material suspended therein). In a non-limiting example, the latch plate 54 comprises 430 stainless steel (as defined by standards on steel grades maintained by SAE International (formerly the Society of Automotive Engineers), also referred to as S4300 steel under the unified numbering system (UNS) for alloys (managed by ASTM International (formerly the American Society for Testing and Materials) and SAE International), or as 1.4016 steel (as defined by the European Standards (ENs) for steel grades maintained by the European Committee for Standardization (CEN)), or SUS430 steel (under the steel grades of the Japanese Industrial Standard (JIS) maintained by the Japanese Industrial Standards Committee (JISC)).

Figure 8:
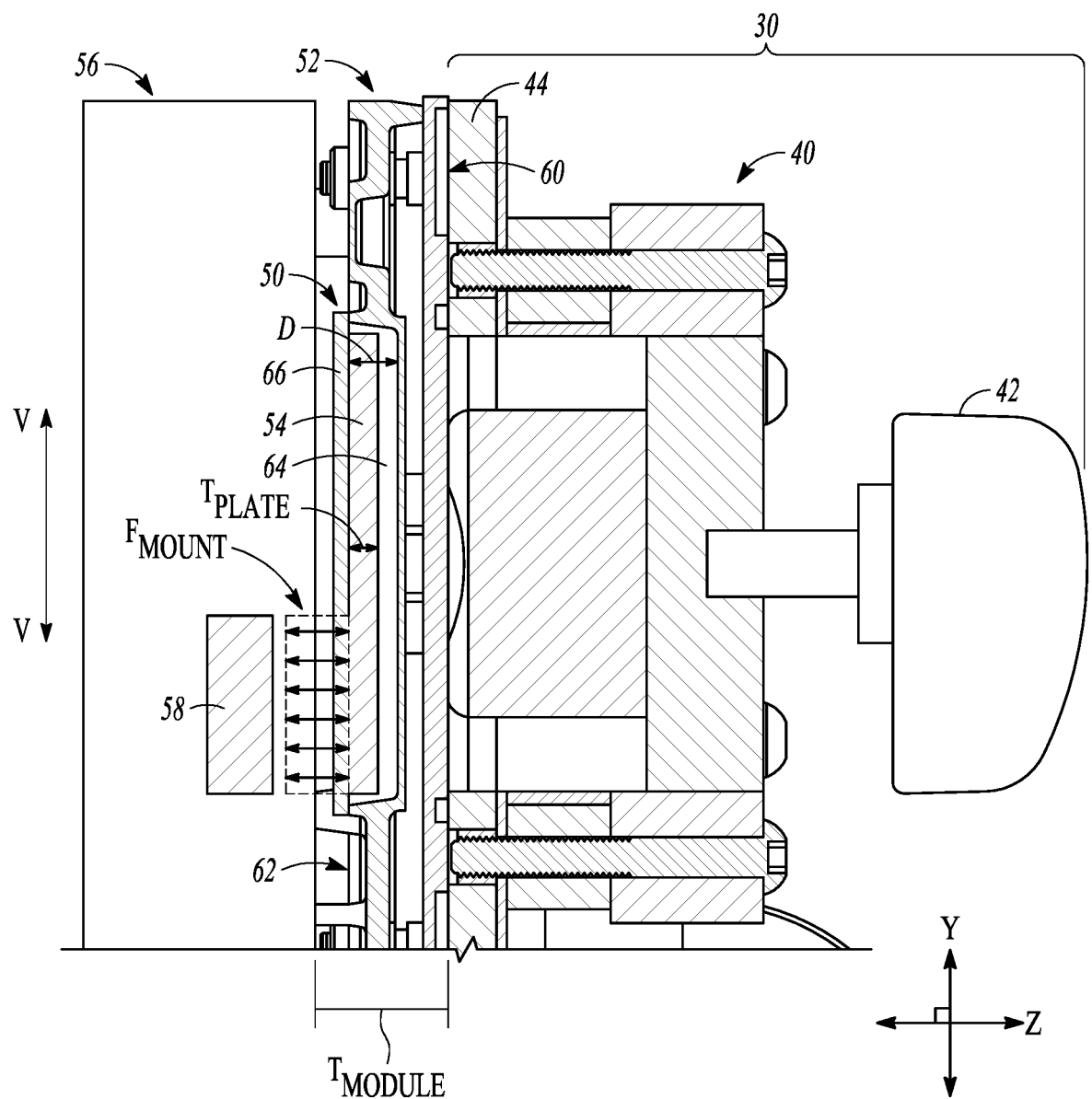
FIG. 8 is a cross-sectional side view of the example magnetic latch and the example installation and removal tool taken along the section plane designed 8-8 in FIG. 7, with the floating latch plate of the magnetic latch being in a latching position that generates a mounting magnetic force between the latch plate and a mounting magnet located in or on a support chassis.
Figure 9:
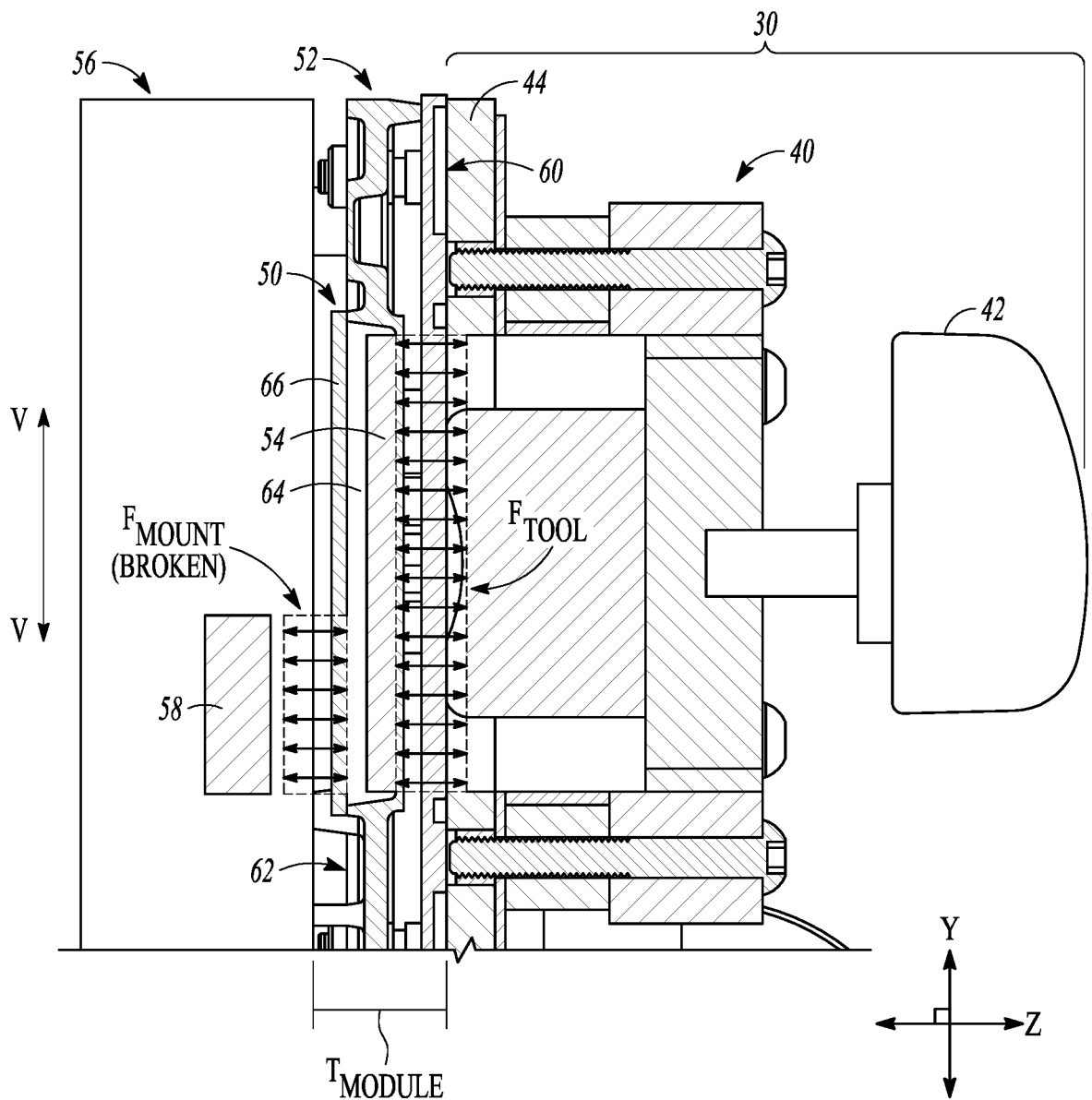
FIG. 9 is a cross-sectional side view of the example magnetic latch and the example installation and removal tool taken along the same section plane as in FIG. 8, wherein a magnetic device of the installation and removal tool has been placed into a state that generates a tool magnetic force between the magnetic device and the floating latch plate to move the latch plate to a non-latching position.

In an example, the latching position of the latch plate 54 is in a rearward position relative to the rest of the display module 52, e.g., at or proximate to a rear face 62 of the display (best seen in FIG. 8), and the non-latching position is in a forward position relative to the rest of the display module 52, e.g., spaced slightly forward from the rear face 62 (best seen in FIG. 9). As used herein, the terms "forward" and "rearward," when referring to the position of the latch plate 54 relative to the display module 52 as a whole (of the relative position of any structure relative to the overall display module 52) refers to the relative position in the direction of the thickness $T_{Module}$ of the display module 52 (best seen in FIGS. 5, 8, and 9). The terms "forward" and "rearward" are used simply as a matter of relative positional reference and so that positioning of structures of the display module 52 can be described with relative brevity. In general, the term "forward" (e.g., "in a forward position" or "more forward than . . .") is used herein to refer to the direction or side of the display module 52 on which the LEDs are mounted to provide a module display surface, which is also referred to as the "front face 60" of the display module 52. The term "rearward," therefore, is generally used to refer to the direction that is generally opposite that of "forward," i.e. to the direction or side of the display module 52 that is opposed to the front face 60, which is also referred to as the "rear face 62" of the display module 52. In some examples, both the front face 60 and the rear face 62 of the display module 52 form major surfaces of the display module 52, e.g., the front and rear faces 60, 62 each have a substantially larger surface area compared to other faces of the display module 52 (such as one or more lateral sides, a top side, and a bottom side which can be substantially narrower than the front and rear faces 60, 62). In some examples, both the front face 60 and the rear face 62 of the display module 52 are generally planar and the rear face 62 is parallel or substantially parallel to the front face.

To assist in describing relative positions and directions for the structures of the display module 52, the display module 52 can also be defined using rectilinear Cartesian coordinates, with the x- and y-directions being defined as the directions in which the planar or substantially planar front and rear faces 60,62 extend (e.g., corresponding to a horizontal direction H and a vertical direction V, respectively), and the z-direction being defined as the direction of the thickness dimension $T_{Module}$, as depicted by the x-axis, y-axis, and z-axis shown in FIGS. 5-9. Therefore, the "rearward first position" (shown in FIG. 8) of the latch plate 54 mentioned above can also be described as being the position that is more toward the rear of the display module 52 in the z-direction, while the "forward second position" (shown in FIG. 9) can also be described as being the position that is more toward the front of the display module 52 in the z-direction.

In the example shown in FIGS. 5-9, the latch plate 54 is not directly coupled to any structure of the display module 52 or the magnetic latch 50 such that the latch plate 54 is physically free to move relative to the display module 52 and other structures of the magnetic latch 50 within a limited range of motion between the rearward latching position and the forward non-latching position. In other words, the latch plate 54 is "free-floating" within the range of motion between the rearward latching position and the forward non-latching position. In particular, the latch plate 54 is free-floating in the z-direction, while still being mostly constrained in the x-direction and the y-direction.

In the example shown in FIGS. 5-9, each magnetic latch 50 includes a plate compartment 64 in which the latch plate 54 of that magnetic latch 50 is at least partially enclosed. The plate compartment 64 is sized to allow for the free-floating movement of the latch plate 54 described above. In an example, best seen in FIGS. 8 and 9, a depth D of the plate compartment 64 in z-direction that is larger than a thickness $T_{Plate}$ of the latch plate 54 in the z-direction when the latch plate 54 is placed within the plate compartment 64. The larger depth D of the plate compartment 64 compared to the thickness $T_{Plate}$ of the latch plate 54 allows the latch plate 54 to move a specified distance in the z-direction corresponding to the distance between the rearward latching position (FIG. 8) and the forward non-latching position (FIG. 9).

Figure 6:
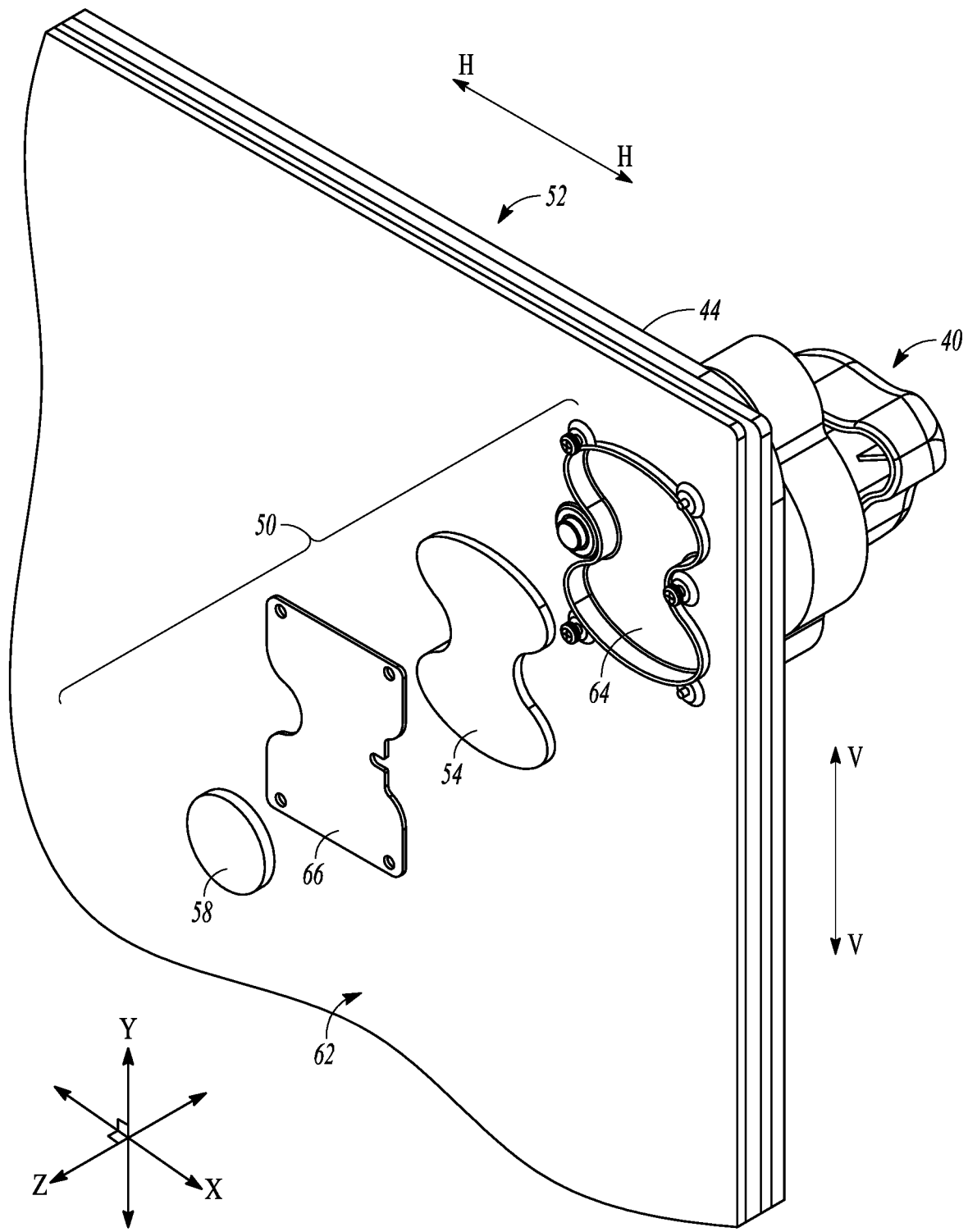
FIG. 6 is a close-up exploded perspective view of one of the magnetic latches of the display module of FIG. 5.

In an example, the latch plate 54 has a specified cross-sectional geometry (such as the example hour-glass shaped cross section best seen in FIG. 6). The plate compartment 64 can have a corresponding cross-sectional geometry that substantially matches the specified cross-sectional geometry of the latch plate 54 (such as the substantially matching hour-glass cross section of the plate compartment 64 best seen in FIG. 6). The corresponding or substantially matching cross-sectional geometries of the latch plate 54 and the plate compartment 64 can allow the plate compartment 64 to maintain the orientation of the latch plate 54 relative to the rear face 62 of the display module 52, e.g., by preventing or limiting rotation of the latch plate 54 within the plane of the formed in the x- and y-directions (e.g., the plane that extends in the horizontal direction H and the vertical direction V and that is normal or substantially normal to the z-direction). In some examples, the relative orientation of the latch plate 54 in this plane is important to ensure that the latch plate 54 will magnetically engage with a magnetically engageable structure in or on the support chassis 56 (such as the chassis magnet 58 shown in FIGS. 6, 7, 8, and 9), and so that the latch plate 54 can magnetically engage with the magnetic device 40 when the magnetic device 40 is in an attracting state.

Figure 7:
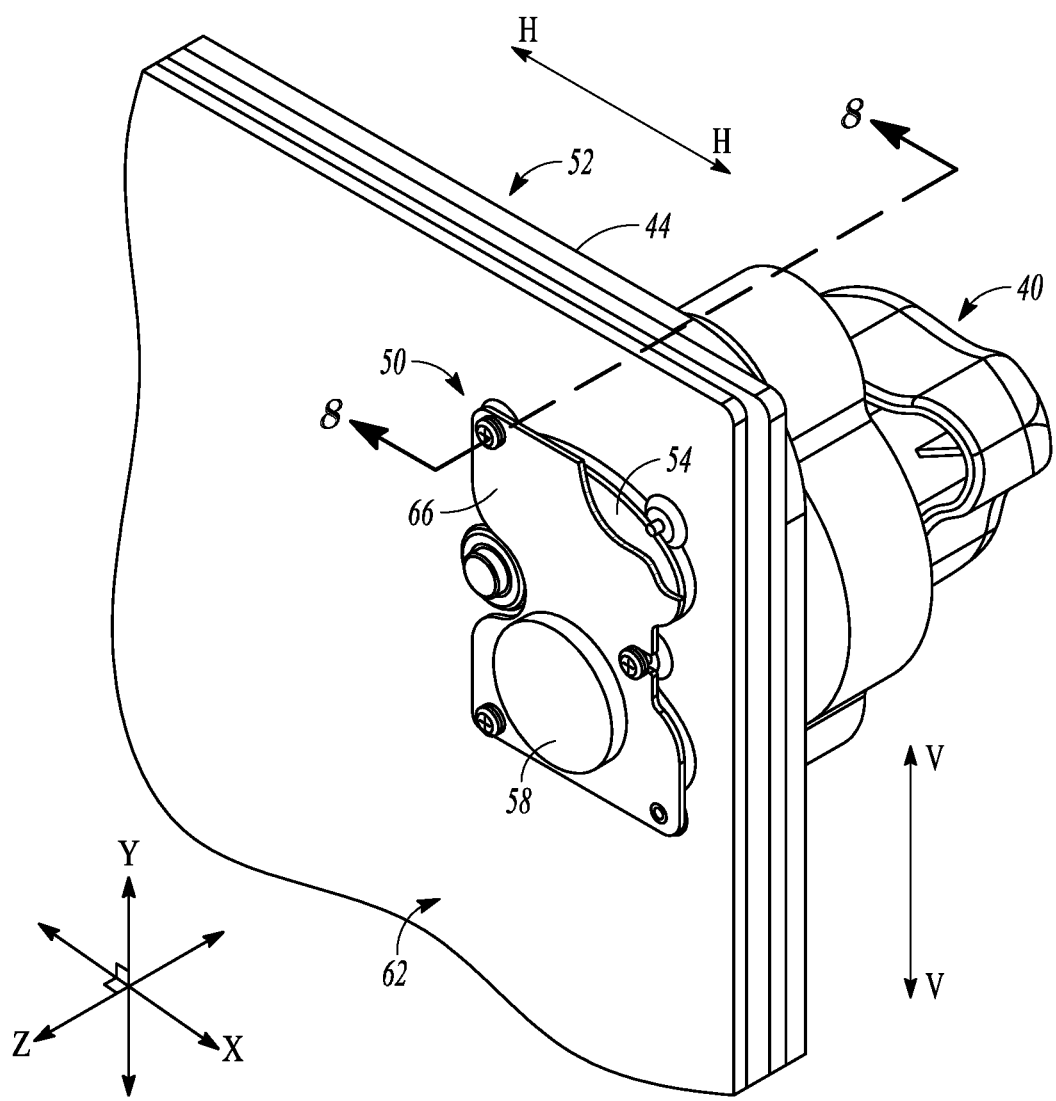
FIG. 7 is a close-up perspective view of the magnetic latch shown in FIG. 6 in an assembled state.

A rear cover 66 can be coupled to the display module 52 so that the rear cover 66 at least partially encloses the plate compartment 64 and at least partially covers the latch plate 54. The rear cover 66 can secure the latch plate 54 inside the plate compartment 64, as is best seen in FIGS. 7-9. The plate compartment 64 and the rear cover 66 cooperatively act to secure the latch plate 54 while still allowing it to be free floating, as described above. In an example, the plate compartment 64 is a cavity in the display module 52 at the rear face 62. For example, the display module 52 can include a frame or other support structure made from a polymeric material that is molded to include the shape of the plate compartment 64 therein, or a portion of the frame of the display module 52 can be made from a metal or other material that is machined to produce the cavity of the plate compartment 64.

FIGS. 8 and 9 show the operation of the magnetic latch 50. The installation tool 30 is shown as being placed against the front face 60 of the display module 52. In FIG. 8, the magnetic device 40 is in the non-attracting state (i.e., the physical magnet of the magnetic device 40 is not positioned or oriented properly relative to the latch plate 54 to generate a sufficient tool magnetic force $F_{Tool}$, or in examples where the magnetic device 40 comprises a electromagnetic mechanism, the mechanism is deactivated so that no electromagnetic force is generated). Because there is not a sufficient tool magnetic force $F_{Tool}$ being formed between the magnetic device 40 and the latch plate 54, the mounting magnetic force $F_{Mount}$ that exists between the latch plate 54 and the chassis mating structure (i.e., a chassis magnet 58 in the example of FIGS. 6-9) attracts the floating latch plate 54 toward the rearward latching position. The magnitude of the mounting magnetic force $F_{Mount}$ between the latch plate 54 and the chassis magnet 58 or other chassis mating structure is sufficient such that the combination of the mounting magnetic forces $F_{Mount}$ between the latch plates 54 of all of the plurality of magnetic latches 50 and the corresponding one or more chassis magnets 58 or other chassis mating structures can securely hold the display module 52 in position against the support chassis 56 without the need for other securing structures (e.g., without a separate physical latch or securing structures such as fasteners).

In FIG. 9, the magnetic device 40 of the installation tool 30 has been put into the attracting state so that a sufficient tool magnetic force $F_{Tool}$ is generated between the magnetic device 40 and the latch plate 54. The magnetic device 40 is configured such that when the magnetic device 40 is in the attracting state the magnitude of the tool magnetic force $F_{Tool}$ is higher than the mounting magnetic force $F_{Mount}$ between the latch plate 54 and the chassis magnet 58. This allows the latch plate 54 to be moved by the tool magnetic force $F_{Tool}$ away from the rearward latching position and into the forward non-latching position. In an example, the increased separation distance between the latch plate 54 and the chassis magnet 58 corresponding to the change from the latching position to the non-latching position is enough to weaken the mounting magnetic force $F_{Mount}$ to a sufficient degree that the mounting magnetic force $F_{Mount}$ will no longer hold the display module 52 onto the support chassis 56, or at least will sufficiently weaken the mounting magnetic force $F_{Mount}$ so that the display module 52 can be pulled away from the support chassis 56 using a relatively small manual force that can be applied by the person uninstalling the display module 52.

In one example, the chassis magnet 58 (or other mating structure of the support chassis 56) is sized or positioned, or both, so that it is aligned with only a portion of the surface area of the latch plate 54 corresponding to that chassis magnet 58. In some examples, the portion of the latch plate 54 surface area that is aligned with the chassis magnet 58 is smaller than the portion of the latch plate 54 surface area that is aligned with the magnetic device 40, and in some examples substantially smaller. For example, as shown in the example of FIGS. 6 and 7, the chassis magnet 58 can be sized with a major surface area that is about 70% of the surface area of the latch plate or less, such as about 60% of the latch plate surface area or less, for example about 50% of the latch plate surface area or less, such as about 45% of the latch plate surface area or less, for example about 40% of the latch plate surface area or less. The smaller relative size of the chassis magnet 58 is such that the mounting magnetic force $F_{Mount}$ that is generated between the chassis magnet 58 and the latch plate 54 is applied to an area that is smaller than the latch plate 54 (as shown in FIG. 8). In contrast, the portion of the latch plate surface area that is aligned with the magnetic device 40 can be larger, and in some examples much larger, for example the magnetic device 40 can be aligned with greater than 60% of the latch plate surface area, such as at least 70% of the latch plate surface area, for example at least 80% of the latch plate surface area, such as at least 90% of the latch plate surface area, and in some examples the magnetic device 40 is aligned with 100% of the latch plate surface area. The larger overlapping surface area between the latch plate 54 and the magnetic device 40 is such that when the magnetic device 40 is in the attracting state the tool magnetic force $F_{Tool}$ is applied to a larger area of the latch plate 54 than the mounting magnetic force $F_{Mount}$ (as shown in FIG. 9). In some examples, the difference in the applied area of the mounting magnetic force $F_{Mount}$ relative to the tool magnetic force $F_{Tool}$ can make it easier for the magnetic device 40 to overcome the mounting magnetic force $F_{Mount}$.

In some examples, the chassis magnet 58 is aligned to be off-center relative to the latch plate 54 such that the mounting magnetic is applied non-uniformly to the latch plate 54 (i.e., away from a central axis of the latch plate 54). In contrast, the magnetic device 40 is configured to be concentric or substantially concentric with the latch plate 54, or at least with the central axis of the magnetic device 40 being closer to the central axis of the latch plate 54 than a central axis of the chassis magnet 58, so that the tool magnetic force $F_{Tool}$ is applied more uniformly to the latch plate 54 than the mounting magnetic force $F_{Mount}$. In such examples, the combination of the non-uniform and off-center mounting magnetic force $F_{Mount}$ and the uniform and/or centrally-applied tool magnetic force $F_{Tool}$ can cause the latch plate 54 to pivot slightly relative to the display module 52 while being attracted by the magnetic device 40, which in turn can allow the magnetic device 40 to overcome the mounting magnetic force $F_{Mount}$ from a stronger chassis magnet 58 than could be overcome if the chassis magnet 58 were more centrally located. This is so because the mounting magnetic force $F_{Mount}$ is often adversely affected when the latch plate 54 and the chassis magnet 58 are not parallel or substantially parallel to one other.

The interruption or breaking of the mounting magnetic force $F_{Mount}$ via the generation of the tool magnetic force $F_{Tool}$ and movement of the latch plate 54 provides for an improvement over previous systems that used magnetic mounting with large, fixed steel plates or other fixed mating structures in or on the display module 52 that engages one or more magnets in or on a support chassis 56 or cabinet. In those previous systems, the magnetic attraction between the large and fixed steel plate and the cabinet magnets had to be overcome solely via manual force applied by the person uninstalling the display module 52. Not only that, but the magnetic attraction force between large fixed plate and the cabinet magnets would act in a direction that directly opposed the motion of removing the display module 52. Similar problems could occur during installation if the display module 52 was not properly aligned, which could occur frequently because the large size of the fixed steel plate in or on the display module 52.

In contrast, the floating latch plate 54 that is moved by the tool magnetic force $F_{Tool}$ generated by the corresponding magnetic device 40 reduces the force that must be applied to the display module 52 in order to separate the display module 52 from the support chassis 56. This reduces the likelihood of the display module 52 being inadvertently damaged during removal because there is less force being applied by the user onto the display module 52 during removal. The reduction in the necessary force also makes removal of the display module 52 much easier and much less reliant on brute strength. This, in turn, makes a larger number of people eligible to perform the installation and removal of display modules 52, and therefore increases the potential supply of installers for the display modules 52 and the resulting display. The reduced difficulty, the reduced chance of damage, and the increased number of potential installers can result in a significant reduction in the cost of installing, maintaining, replacing, or removing electronic displays comprising display modules 52 that incorporate the technology of the present disclosure.

The specific force selected for the mounting magnetic force $F_{Mount}$ and the tool magnetic force $F_{Tool}$ can depend on several factors include, but not limited to, the weight of the display module 52, the size of the display module 52, the accessibility of the overall electronic display. In an example, the mounting magnetic force $F_{Mount}$ between the latch plate 54 and the chassis magnet 58 or other chassis mating structure when the latch plate 54 is in the latching position is from about 2.5 pounds force (lbf) (e.g., about 10 newtons (N)) to about 10 lbf (e.g., about 45 N) per magnetic latch 50, such as from about 5 lbf (e.g., about 20 N) to about 6 lbf (e.g., about 30 N). As noted above, when the latch plate 54 moves from the latching position to the non-latching position, it creates a larger gap between the latch plate 54 and the chassis magnet 58 or other chassis mating structure. In an example, this increased gap causes the mounting magnetic force $F_{Mount}$ between the latch plate 54 and the chassis magnet 58 or other chassis mating structure to be reduced down to as little as 1 lbf or lower (e.g., about 4.5 N or lower), such as 0.5 lbf or lower (e.g., about 2 N or lower) or about 0.25 lbf or lower (e.g., about 1 N or lower). In some examples, the mounting magnetic force $F_{Mount}$ when the latch plate 54 is in the latching position is sufficiently high such that 8 or fewer magnetic latches 50 are sufficient to hold the entire weight of the display module 52 and keep the display module 52 aligned and oriented in the desired and specified orientation relative to the support chassis 56 and other display modules 52 without the use of any other fastening or mounting structures. In some examples, the mounting magnetic force $F_{Mount}$ when the latch plate 54 is in the latching position is sufficiently high such that 6 or fewer magnetic latches 50 are sufficient to hold the entire weight of the display module 52, such as 5 or fewer magnetic latches 50, for example 4 or fewer magnetic latches 50. The tool magnetic force $F_{Tool}$ between the latch plate 54 and the magnetic device 40 when the magnetic device 40 is in the attracting state can be from about 25 lbf (e.g., about 100 N) to about 300 lbf (e.g., about 1300 N), such as from about 50 lbf (e.g., about 225 N) to about 250 lbf (e.g., about 1100 N), for example from about 100 lbf (e.g., about 450 N) to about 235 lbf (e.g., about 1000 N). Those of skill in the art will appreciate that there may be quite a bit of variation in the mounting magnetic force $F_{Mount}$ and in the tool magnetic force $F_{Tool}$ that is desirable depending on the specific application and conditions in which the overall display will be installed and operated.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A display module comprising:
a module support structure;
a plurality of light-emitting elements mounted to the front face of the module support structure; and
one or more latch assemblies configured to selectively removably couple the module support structure to a support chassis, wherein each of the one or more latch assemblies comprises;
a latch plate comprising a magnetically-engageable material, wherein the latch plate is movable relative to the module support structure within a range of motion between a first plate position and a second plate position;
wherein the magnetically-engageable material of the latch plate forms a first magnetic attraction force between the latch plate and a mating structure coupled to the support chassis when the latch plate is in the first plate position, wherein the first magnetic attraction force at least partially magnetically secures the display module to the support chassis proximate to the latch assembly when the latch plate is in the first plate position, and
wherein a corresponding magnetic device can generate a second magnetic attraction force between the corresponding magnetic device and the latch plate that overcomes the first magnetic attraction force and moves the latch plate from the first plate position to the second plate position.

2. The display module according to claim 1, further comprising a compartment in or on the module support structure that at least partially contains the latch plate while allowing the latch plate to move within the range of motion between the first plate position and the second plate position.

3. The display module according to claim 1, wherein the latch plate is not directly coupled to the module support structure.

4. The display module according to claim 1, wherein, when the latch plate is in the second plate position the first magnetic attraction force between the latch plate and the mating structure is not sufficient to secure the display module to the support chassis.

5. The display module according to claim 1, wherein:
the magnetically-engageable material of the latch plate comprises a magnetizable material and the mating structure coupled to the support chassis comprises a magnetic material; or
the magnetically-engageable material of the latch plate comprises a magnetic material and the mating structure coupled to the support chassis comprises a magnetizable material.

6. The display module according to claim 1, wherein the first magnetic attraction force of all of the one or more latch assemblies is sufficient to magnetically secure the display module to the support chassis when each latch plate of the one or more latch assemblies are in the first plate position.

7. A display system comprising:
a support chassis including a plurality of mating structures each comprising a first magnetically-engageable material;
a module installation and removal tool comprising a plurality of magnetic devices, each magnetic device being changeable between a first magnetic state and a second magnetic state; and
a plurality of display modules each comprising:
a module support structure comprising a substantially planar front face;
a plurality of light-emitting elements mounted to the front face of the module support structure; and
a plurality of latch assemblies configured to selectively removably couple the module support structure to the support chassis, wherein each of latch assemblies comprises;
a latch plate that is free or substantially free to move relative to the module support structure within a range of motion between a first plate position and a second plate position relative to the module support structure, wherein the latch plate comprises a second magnetically-engageable material;
wherein a first magnetic attraction force is formed between the first magnetically-engageable material of a corresponding one of the mating structures and the second magnetically-engageable material of the latch plate when the latch plate is in the first plate position, wherein the first magnetic attraction force magnetically secures the display module to the support chassis when the latch plate is in the first plate position, and
wherein a corresponding one of the plurality of magnetic device generates a second magnetic attraction force between the corresponding magnetic device and the second magnetically-engageable material of the latch plate when the corresponding magnetic device is in the first magnetic state, wherein the second magnetic attraction force is sufficient to overcome the first magnetic attraction force and move the latch plate from the first plate position to the second plate position when the corresponding magnetic device is in the first magnetic state.

8. The display system according to claim 7, wherein, when the latch plate is in the second plate position magnetic attraction between the latch plate and the corresponding one of the mating structures is not sufficient to secure the display module to the support chassis.

9. The display system according to claim 7, wherein:
the first magnetically-engageable material of each of the mating structures comprises a magnetic material and the second magnetically-engageable material of the latch plate comprises a magnetizable material; or
the first magnetically-engageable material of each of the mating structures comprises a magnetizable material and the second magnetically-engageable material of the latch plate comprises a magnetic material.

10. The display system according to claim 7, wherein the first magnetically-engageable material of each of the mating structures comprises a first magnetic material and the second magnetically-engageable material of the latch plate comprises a second magnetic material, wherein, when the latch plate is in the first plate position the first magnetic attraction force is formed between the first magnetic material of the latch plate and the second magnetic material of the corresponding one of the mating structures.

11. The display system according to claim 7, wherein the second magnetic attraction force is not sufficient to move the latch plate to the second plate position when the corresponding magnetic device is in the second magnetic state.

12. The display system according to claim 7, wherein a combination of the first magnetic attraction forces between the latch plates of all of the latch assemblies and all of the corresponding mating structures is sufficient to magnetically secure the display module to the support chassis when all of the latch plates are in the first plate position.

13. The display system according to claim 7, wherein the first magnetic attraction force is applied to a first cross-sectional area of the latch plate and the second magnetic attraction force is applied to a second cross-sectional area of the latch plate, wherein the second cross-sectional area is larger than the first cross-sectional area.

14. The display system according to claim 7, wherein a central axis of the corresponding mating structure is off-center relative to a central axis of the latch plate.

15. The display system according to claim 7, wherein the module support structure comprises a substantially planar front face and the plurality of light-emitting elements are mounted to the substantially planar front face, wherein the latch plate is substantially planar and is oriented so that it is generally parallel to the front face, and wherein the range of motion of the latch plate is in a direction that is substantially perpendicular to the front face.

16. A display module comprising:
    a module support structure comprising a substantially planar front face;
    a plurality of light-emitting elements mounted to the front face of the module support structure; and
    one or more latch assemblies configured to selectively removably couple the module support structure to a support chassis, wherein each of the one or more latch assemblies comprises;
        a latch plate comprising a magnetically-engageable material, wherein the latch plate is substantially planar and is oriented so that it is generally parallel to the front face, wherein the latch plate is movable relative to the module support structure within a range of motion between a first plate position and a second plate position, wherein the range of motion is in a direction that is substantially perpendicular to the front face;
    wherein the magnetically-engageable material of the latch plate forms a first magnetic attraction force between the latch plate and a mating structure coupled to the support chassis when the latch plate is in the first plate position to at least partially magnetically secure the display module to the support chassis proximate to the latch assembly, and
    wherein a corresponding magnetic device can generate a second magnetic attraction force between the corresponding magnetic device and the latch plate that overcomes the first magnetic attraction force and moves the latch plate from the first plate position to the second plate position.

17. The display module according to claim 16, wherein the latch plate is not directly coupled to the module support structure.

18. The display module according to claim 16, wherein, when the latch plate is in the second plate position the first magnetic attraction force between the latch plate and the mating structure is not sufficient to secure the display module to the support chassis.

19. The display module according to claim 16, wherein the first magnetic attraction force of all of the one or more latch assemblies is sufficient to magnetically secure the display module to the support chassis when each latch plate of the one or more latch assemblies are in the first plate position.

* * * * *